(12) United States Patent
Utsumi

(10) Patent No.: US 8,217,496 B2
(45) Date of Patent: Jul. 10, 2012

(54) INTERNAL MATCHING TRANSISTOR

(75) Inventor: Hiromitsu Utsumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/025,589

(22) Filed: Feb. 11, 2011

(65) Prior Publication Data

US 2011/0278700 A1    Nov. 17, 2011

(30) Foreign Application Priority Data

May 14, 2010   (JP) ................................. 2010-112248

(51) Int. Cl.
*H01L 29/93*    (2006.01)
(52) U.S. Cl. ........ 257/595; 257/565; 257/566; 257/572; 257/E29.344
(58) Field of Classification Search ................... 257/595, 257/594, 572, 573, E29.344, 565, 566
See application file for complete search history.

(56) References Cited

U.S. PATENT DOCUMENTS 5,157,357 A * 10/1992 Katoh ............................. 331/74
5,592,122 A * 1/1997 Masahiro et al. ............. 330/286
6,281,756 B1 * 8/2001 Goto et al. ..................... 330/302

FOREIGN PATENT DOCUMENTS

| JP | 4-48756 | 2/1992 |
| JP | 4-154311 | 5/1992 |
| JP | 7-130913 | 5/1995 |
| JP | 2008-35336 | 2/2008 |
| JP | 2008-533899 | 8/2008 |

OTHER PUBLICATIONS

Wikipedia web document about capacitor dated Dec. 31, 2011 (21 pages).*

* cited by examiner

*Primary Examiner* — Thinh T Nguyen
(74) *Attorney, Agent, or Firm* — Oblon, Spivak, McClelland, Maier & Neustadt, L.L.P.

(57) ABSTRACT

An internal matching transistor comprises: a conductive base material including a groove, a first region, and a second region which is located opposite to the first region across the groove; a transistor bonded onto the first region of the base material; an internal matching circuit bonded onto the second region of the base material; a wire connecting the transistor to the internal matching circuit across above the groove; and a conductive or non-conductive material located between the wire and the groove, wherein capacitance between the wire and the base material is adjusted by the material.

4 Claims, 8 Drawing Sheets

INTERNAL MATCHING TRANSISTOR

BACKGROUND OF THE INVENTION

1. Field of the Invention

The present invention relates to a high output internal matching transistor used in a microwave band, and more particularly, to an internal matching transistor capable of adjusting an operating frequency band without changing an internal matching circuit or package outside size.

2. Background Art

In recent years, internal matching transistors in which a transistor solder-bonded to a base material is connected to an internal matching circuit via a gold wire are used (e.g., see Japanese Patent Laid-Open No. 4-48756). A V-groove is formed on a base plate between the transistor and the internal matching circuit. The V-groove is used for aligning the transistor with the internal matching circuit and preventing wraparound of solder.

SUMMARY OF THE INVENTION

Conventionally, internal matching circuits are changed according to an operating frequency. Matching between the transistor and the internal matching circuit is achieved by changing the length or height in the horizontal direction of the gold wire. Thus, the internal matching circuit or the package outside size needs to be changed according to the operating frequency band.

In view of the above-described problems, an object of the present invention is to provide an internal matching transistor capable of adjusting an operating frequency band without changing an internal matching circuit or package outside size.

According to the present invention, an internal matching transistor comprises: a conductive base material including a groove, a first region, and a second region which is located opposite to the first region across the groove; a transistor bonded onto the first region of the base material; an internal matching circuit bonded onto the second region of the base material; a wire connecting the transistor to the internal matching circuit across above the groove; and a conductive or non-conductive material located between the wire and the groove, wherein capacitance between the wire and the base material is adjusted by the material.

The present invention makes it possible to provide an internal matching transistor capable of adjusting an operating frequency band without changing an internal matching circuit or package outside size.

Other and further objects, features and advantages of the invention will appear more fully from the following description.

DETAILED DESCRIPTION OF THE PREFERRED EMBODIMENTS

An internal matching transistor according to the embodiments of the present invention will be described with reference to the drawings. The same components will be denoted by the same symbols, and the repeated description thereof may be omitted.

First Embodiment

Figure 1:
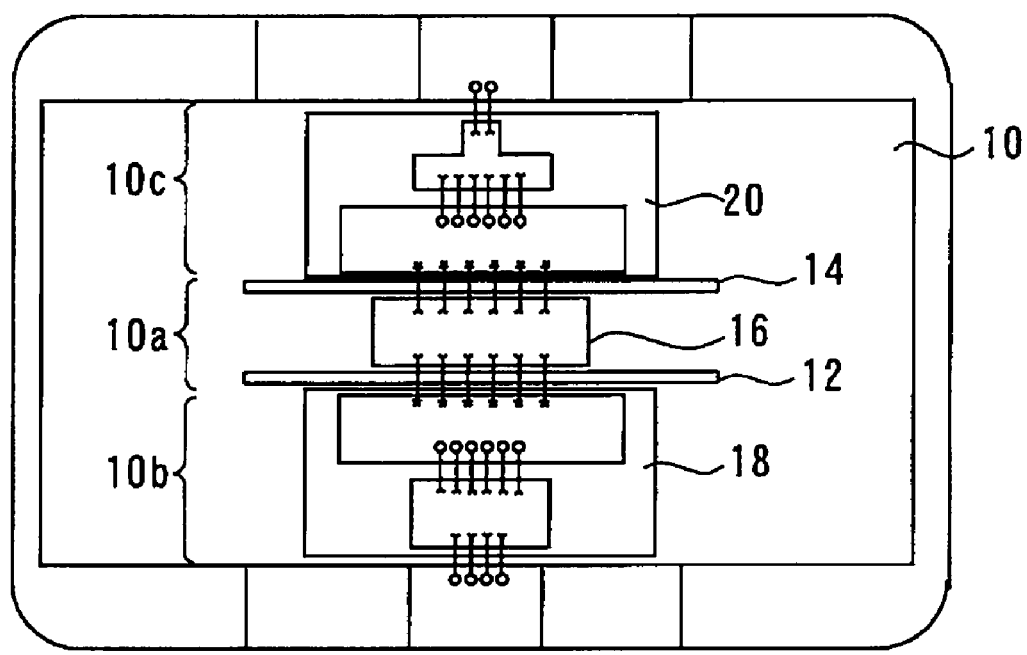
FIG. 1 is a plan view illustrating an internal matching transistor according to the first embodiment.

FIG. 1 is a plan view illustrating an internal matching transistor according to the first embodiment. A base material 10 is an Au-plated conductive metal and the entire base material 10 is set to a GND potential. V-grooves 12 and 14 are provided on the principal surface of the base material 10. The principal surface of the base material 10 has a region 10a located between the V-groove 12 and the V-groove 14, a region 10b located opposite to the region 10a across the V-groove 12 and a region 10c located opposite to the region 10a across the V-groove 14. A transistor 16 is solder-bonded onto the region 10a of the base material 10. An internal matching circuit 18 is solder-bonded onto the region 10b of the base material 10. An internal matching circuit 20 is solder-bonded onto the region 10c of the base material 10.

Figure 2:
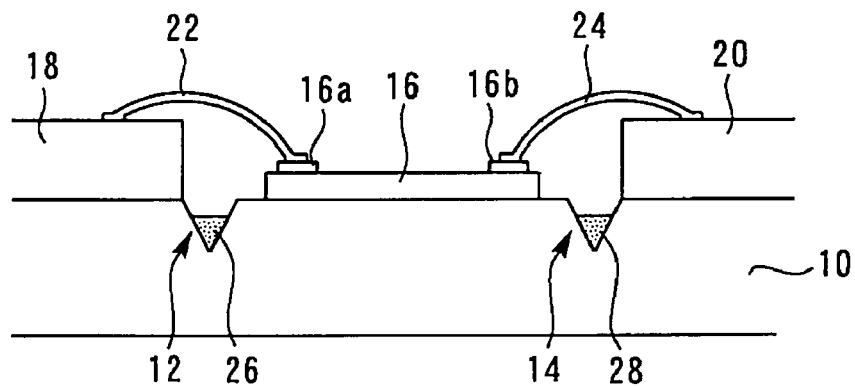
FIG. 2 is an enlarged cross-sectional view illustrating an internal matching transistor according to the first embodiment.

FIG. 2 is an enlarged cross-sectional view illustrating an internal matching transistor according to the first embodiment. A gold wire 22 connects a gate electrode 16a of the transistor 16 and the internal matching circuit 18 across above the V-groove 12. A gold wire 24 connects a drain electrode 16b of the transistor 16 and the internal matching circuit 20 across above the V-groove 14. A source or emitter of the transistor 16 is connected to the base material 10 through a via.

In the present embodiment, a solder material 26 is embedded in the V-groove 12 between the gold wire 22 and the V-groove 12. A solder material 28 is embedded in the V-groove 14 between the gold wire 24 and the V-groove 14. Another conductive material such as conductive resin may be used instead of the solder materials 26 and 28.

Figure 3:
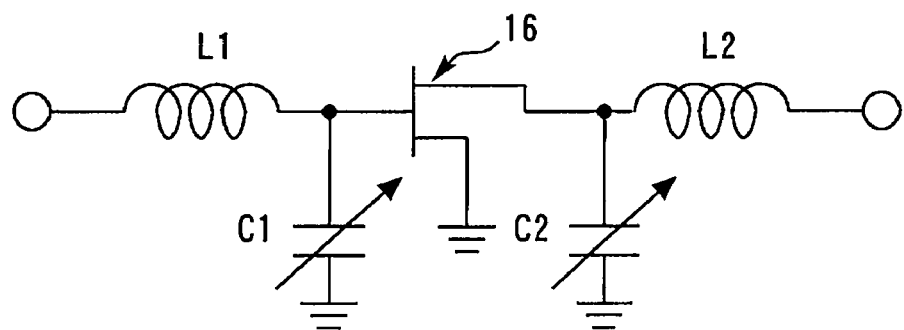
FIG. 3 is an equivalent circuit of the internal matching transistor according to the first embodiment.

FIG. 3 is an equivalent circuit of the internal matching transistor according to the first embodiment. Reference character L1 denotes an inductance of the gold wire 22, L2 denotes an inductance of the gold wire 24, C1 denotes a capacitance between the V-groove 12 and the gold wire 22 and C2 denotes a capacitance between the V-groove 14 and the gold wire 24.

Figure 4:
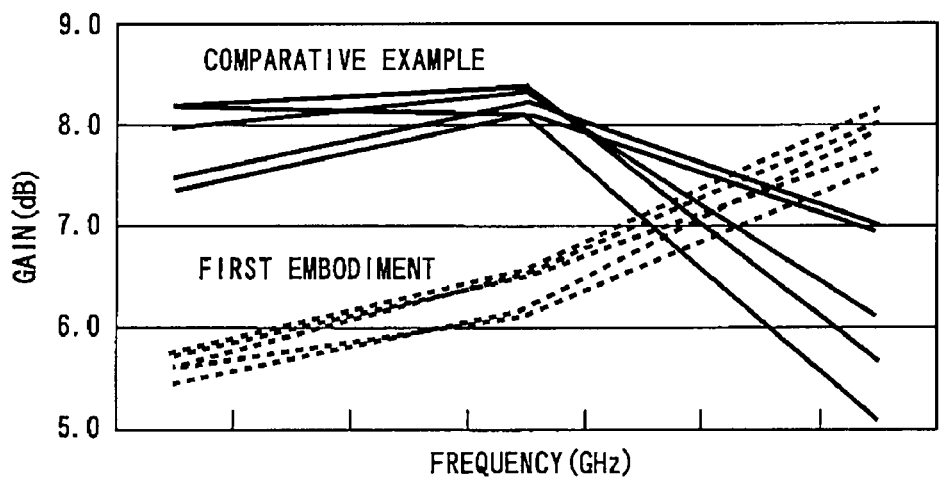
FIG. 4 is a diagram illustrating a result of examining frequency dependency of a gain between first embodiment and a comparative example.

FIG. 4 is a diagram illustrating a result of examining frequency dependency of a gain between first embodiment and a comparative example. The comparative example shows a case where there is no solder material 26. Here, suppose the width of the V-groove 12 is 150 μm, the depth of the V-groove 12 (first embodiment) in which the solder material 26 is embedded is 50 μm and the depth of the V-groove 12 (comparative example) in which the solder material 26 is not embedded is 150 μm. As a result, it has been verified that embedding the solder material 26 in the V-groove 12 can shift the matched frequency band of the gain by the order of 500 MHz.

The present embodiment can change the distance between the gold wires 22 and 24 and the GND potential by adjusting the amount of the solder materials 26 and 28 and thereby adjust capacitances C1 and C2. Therefore, the present embodiment can adjust the operating frequency band without changing the internal matching circuits 18 and 20 or the package outside size.

Second Embodiment

Figure 5:
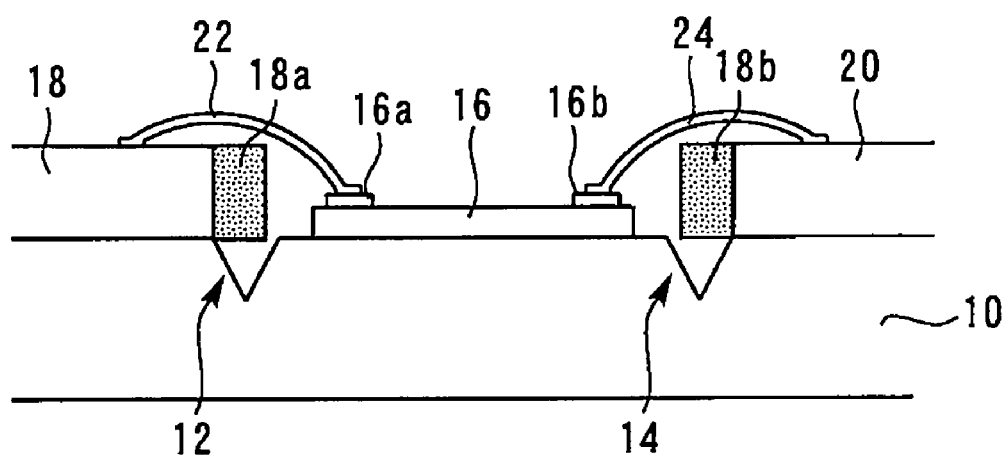
FIG. 5 is an enlarged cross-sectional view illustrating an internal matching transistor according to the second embodiment.

FIG. 5 is an enlarged cross-sectional view illustrating an internal matching transistor according to the second embodiment. Part 18a of a non-conductive (dielectric) internal matching circuit 18 juts out between the gold wire 22 and the V-groove 12 instead of the solder materials 26 and 28 of the first embodiment and part 18b of a non-conductive (dielectric) internal matching circuit 20 juts out between the gold wire 24 and the V-groove 14.

The present embodiment can adjust the capacitances C1 and C2 by changing the material existing in a space between the gold wires 22 and 24 and the base material 10. Therefore, the present embodiment can adjust an operating frequency band without changing the internal matching circuits 18 and 20 or the package outside size.

Third Embodiment

Figure 6:
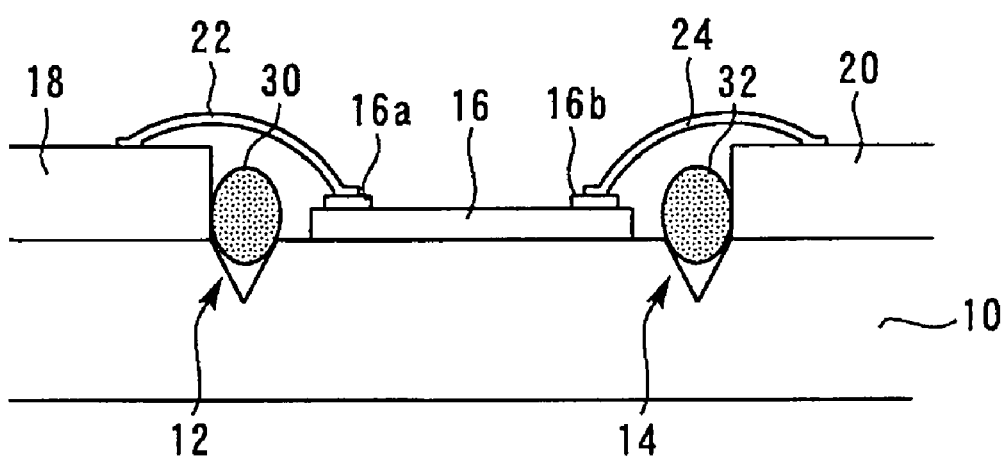
FIG. 6 is an enlarged cross-sectional view illustrating an internal matching transistor according to the third embodiment.

FIG. 6 is an enlarged cross-sectional view illustrating an internal matching transistor according to the third embodiment. A non-conductive (dielectric) resin material 30 is applied between the gold wire 22 and the V-groove 12 and a non-conductive (dielectric) resin material 32 is applied between the gold wire 24 and the V-groove 14 instead of the solder materials 26 and 28 of the first embodiment.

The present embodiment can adjust the capacitances C1 and C2 by changing the material existing in a space between the gold wires 22 and 24 and the base material 10. Therefore, the present embodiment can adjust an operating frequency band without changing the internal matching circuits 18 and 20 or the package outside size.

Fourth Embodiment

Figure 7:
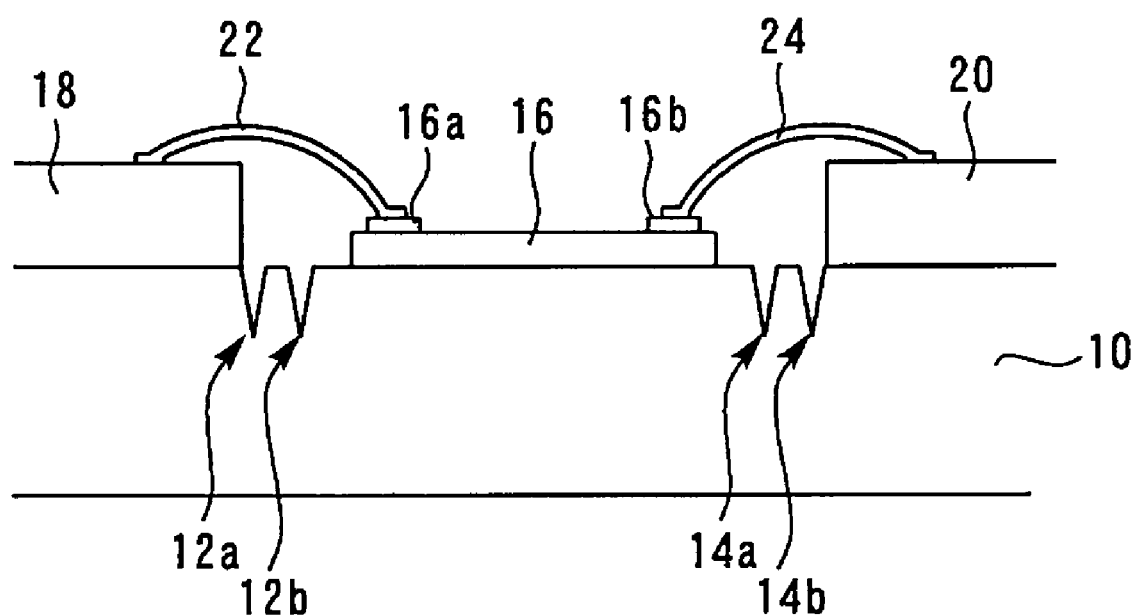
FIG. 7 is an enlarged cross-sectional view illustrating an internal matching transistor according to the fourth embodiment.

FIG. 7 is an enlarged cross-sectional view illustrating an internal matching transistor according to the fourth embodiment. Two V-grooves 12a and 12b are formed in the base material 10 between the transistor 16 and the internal matching circuit 18 and two V-grooves 14a and 14b are formed in the base material 10 between the transistor 16 and the internal matching circuit 20 instead of the solder materials 26 and 28 of the first embodiment.

Figure 8:
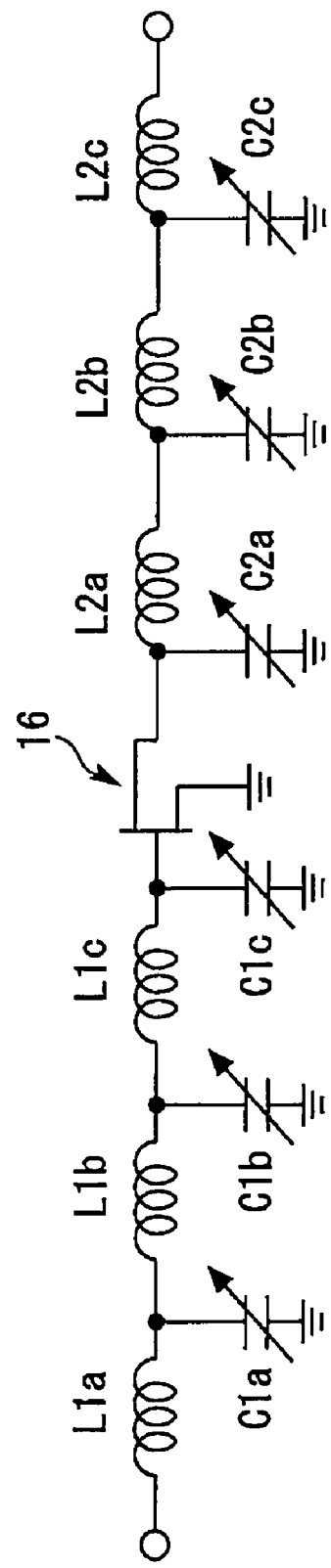
FIG. 8 is an equivalent circuit of the internal matching transistor according to the fourth embodiment.

FIG. 8 is an equivalent circuit of the internal matching transistor according to the fourth embodiment. Reference character L1a denotes an inductance of the gold wire 22 above the V-groove 12a, C1d denotes a capacitance between the V-groove 12a and the gold wire 22. Reference character L1b denotes an inductance of the gold wire 22 above the base material 10 between the V-groove 12a and the V-groove 12b, C1b denotes a capacitance between the base material 10 and the gold wire 22 between the V-groove 12a and the V-groove 12b. Reference character L1c denotes an inductance of the gold wire 22 above the V-groove 12b and C1c denotes a capacitance between the V-groove 12b and the gold wire 22.

Reference character L2a denotes an inductance of the gold wire 24 above the V-groove 14a and C2d denotes a capacitance between the V-groove 14a and the gold wire 24. Reference character L2b denotes an inductance of the gold wire 24 above the base material 10 between the V-groove 14a and the V-groove 14b and C2b denotes a capacitance between the base material 10 and the gold wire 24 between the V-groove 14a and the V-groove 14b. Reference character L2c denotes an inductance of the gold wire 24 above the V-groove 14b and C2c denotes a capacitance between the V-groove 14b and the gold wire 24.

The present embodiment can change the distance between the gold wires 22 and 24 and the GND potential by adjusting the depths of the V-grooves 12a, 12b, 14a and 14b and thereby adjust the capacitances C1 and C2. Therefore, the present embodiment can adjust an operating frequency band without changing the internal matching circuits 18 and 20 or the package outside size.

Figure 9:
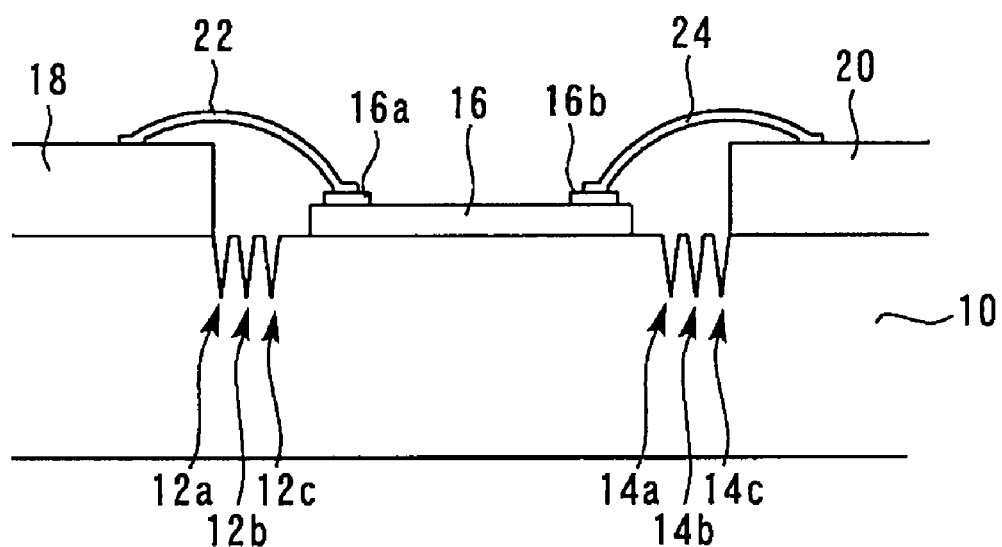
FIG. 9 is an enlarged cross-sectional view illustrating a modification example of the internal matching transistor according to the fourth embodiment.

FIG. 9 is an enlarged cross-sectional view illustrating a modification example of the internal matching transistor according to the fourth embodiment. Three V-grooves 12a, 12b and 12c are formed under the gold wire 22 and three V-grooves 14a, 14b and 14c are formed under the gold wire 24. Similar effects can be obtained in this case, too. Irrespective of this, the number of V-grooves may be set to a range of 2 or above and 10 or below.

Fifth Embodiment

Figure 10:
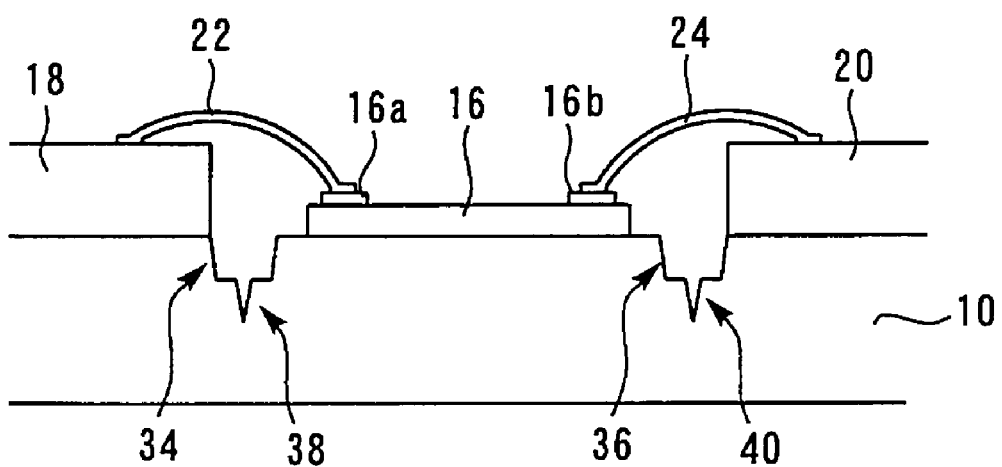
FIG. 10 is an enlarged cross-sectional view illustrating an internal matching transistor according to the fifth embodiment.

FIG. 10 is an enlarged cross-sectional view illustrating an internal matching transistor according to the fifth embodiment. First grooves 34 and 36 and second grooves 38 and 40 are formed instead of the plurality of V-grooves 12a, 12b, 14a and 14b of the fourth embodiment. The first groove 34 is formed in the base material 10 under the gold wire 22 and the second groove 38 is formed in the bottom of the first groove 34. The first groove 36 is formed in the base material 10 under the gold wire 24 and the second groove 40 is formed in the bottom of the first groove 36.

Figure 11:
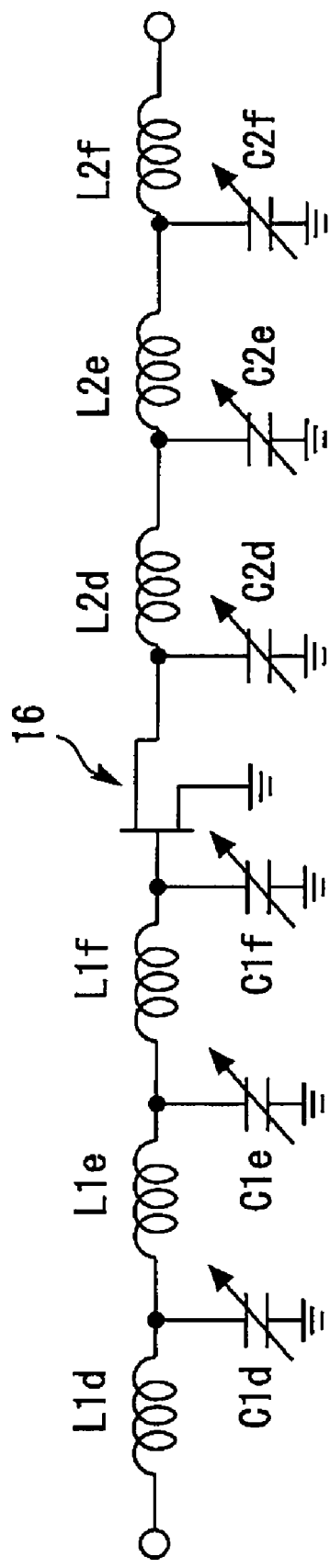
FIG. 11 is an equivalent circuit of the internal matching transistor according to the fifth embodiment.

FIG. 11 is an equivalent circuit of the internal matching transistor according to the fifth embodiment. Reference character L1d denotes an inductance of the gold wire 22 at the upper left of the first groove 34 and C1d denotes a capacitance between the left of the first groove 34 and the gold wire 22. Reference character L1e denotes an inductance of the gold wire 22 above the second groove 38 and C1e denotes a capacitance between the second groove 38 and the gold wire 22. Reference character L1f denotes an inductance of the gold wire 22 at the upper right of the first groove 34 and C1f denotes a capacitance between the right of the first groove 34 and the gold wire 22.

Furthermore, reference character L2d denotes an inductance of the gold wire 24 at the upper left of the first groove 36 and C2d denotes a capacitance between the left of the first groove 36 and the gold wire 24. Reference character L2e denotes an inductance of the gold wire 24 above the second groove 40 and C2e denotes a capacitance between the second groove 40 and the gold wire 24. Reference character L2f denotes an inductance of the gold wire 24 at the upper right of the first groove 36 and C2f denotes a capacitance between the right of the first groove 36 and the gold wire 24.

Even when grooves are formed in two stages as in the present embodiment, the capacitances C1 and C2 can be adjusted in the same way as in the fourth embodiment. Therefore, the present embodiment can adjust the operating frequency band without changing the internal matching circuits 18 and 20 or the package outside size.

Sixth Embodiment

Figure 12:
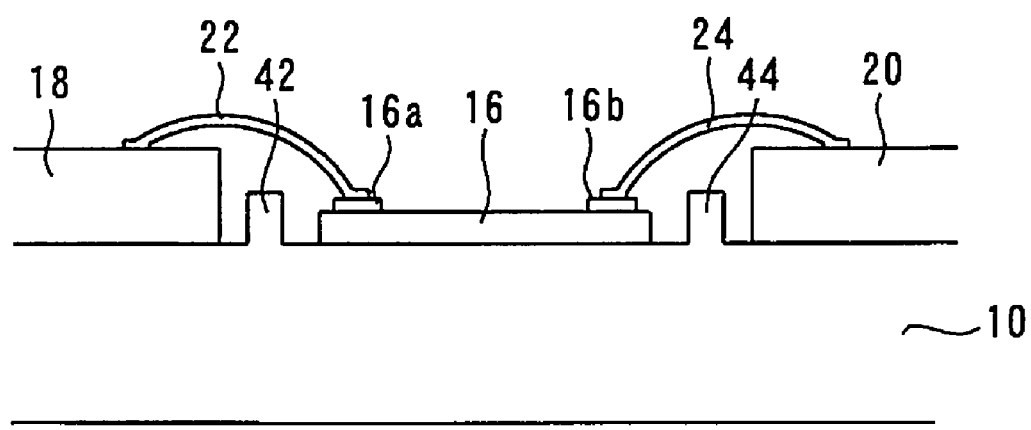
FIG. 12 is an enlarged cross-sectional view illustrating an internal matching transistor according to the sixth embodiment.

FIG. 12 is an enlarged cross-sectional view illustrating an internal matching transistor according to the sixth embodiment. A convex section 42 is provided on the base material 10 under the gold wire 22 and a convex section 44 is provided on the base material 10 under the gold wire 24 instead of the V-groove 12 and the solder material 26 of the first embodiment.

The present embodiment can change the distance between the gold wires 22 and 24 and the GND potential by adjusting the heights of the convex sections 42 and 44 and thereby adjust the capacitances C1 and C2. Therefore, the present embodiment can adjust the operating frequency band without changing the internal matching circuits 18 and 20 or the package outside size.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2010-112248, filed on May 14, 2010 including specification, claims, drawings and summary, on which the Convention priority of the present application is based, are incorporated herein by reference in its entirety.

What is claimed is:

1. An internal matching transistor comprising:
   a conductive base material including a groove, a first region, and a second region which is located opposite to the first region across the groove;
   a transistor bonded onto the first region of the base material;
   an internal matching circuit bonded onto the second region of the base material;
   a wire connecting the transistor to the internal matching circuit across and above the groove; and
   a conductive or non-conductive material located between the wire and the groove,
   wherein capacitance between the wire and the base material is adjusted by the conductive or non-conductive material.

2. The internal matching transistor according to claim 1, wherein the conductive or non-conductive material is a solder material or a conductive resin embedded in the groove.

3. The internal matching transistor according to claim 1, wherein the conductive or non-conductive material is a part of the internal matching circuit which juts out between the wire and the groove.

4. The internal matching transistor according to claim 1, wherein the conductive or non-conductive material is a resin material applied between the wire and the groove.

* * * * *